(12) United States Patent
Kato et al.

(10) Patent No.: US 7,875,319 B2
(45) Date of Patent: Jan. 25, 2011

(54) DRAWING METHOD, DRAWING APPARATUS AND DISPLAY APPARATUS

(75) Inventors: Tsuyoshi Kato, Shiojiri (JP); Mitsuru Kuribayashi, Chino (JP)

(73) Assignee: Seiko Epson Corporation (JP)

( * ) Notice: Subject to any disclaimer, the term of this patent is extended or adjusted under 35 U.S.C. 154(b) by 1168 days.

(21) Appl. No.: 10/959,919

(22) Filed: Oct. 6, 2004

(65) Prior Publication Data

US 2005/0093902 A1   May 5, 2005

(30) Foreign Application Priority Data

Oct. 7, 2003   (JP) .............................. 2003-348423

(51) Int. Cl.
*B05D 5/00* (2006.01)

(52) U.S. Cl. .................... 427/427.3; 427/66; 347/1; 347/37; 347/40; 347/74

(58) Field of Classification Search .................. 427/66, 427/427.3
See application file for complete search history.

(56) References Cited

U.S. PATENT DOCUMENTS

| | | | |
|---|---|---|---|
| 6,099,108 A * | 8/2000 | Weber et al. ................... 347/43 | |
| 6,179,400 B1 | 1/2001 | Akahira et al. | |
| 6,565,206 B2 * | 5/2003 | Okabe et al. ................... 347/107 |
| 2002/0105688 A1 * | 8/2002 | Katagami et al. ............. 358/505 |
| 2004/0009303 A1 | 1/2004 | Ito et al. | |
| 2004/0113962 A1 * | 6/2004 | Mori ........................... 347/12 |

FOREIGN PATENT DOCUMENTS

| | | |
|---|---|---|
| JP | 8-327816 | 12/1996 |
| JP | 10-260307 | 9/1998 |
| JP | 2001-56407 | 2/2001 |
| JP | 2001-056407 | * 2/2001 |
| JP | 2001-100022 | 4/2001 |
| JP | 2003-270422 | 9/2003 |
| JP | 2003-280535 | 10/2003 |
| WO | WO01-14915 | 3/2001 |

OTHER PUBLICATIONS

Communication from Korean Patent Office regarding counterpart application.

* cited by examiner

*Primary Examiner*—Michael Barr
*Assistant Examiner*—Robert S Walters, Jr.
(74) *Attorney, Agent, or Firm*—Harness, Dickey & Pierce, P.L.C.

(57) ABSTRACT

A method is provided to reliably form shot drops on all of a plurality of pixel areas. The method comprises a step of forming a plurality of shot drops by ejecting droplets from a plurality of nozzles of a drawing apparatus to a plurality of pixel areas on a substrate. The step of forming the plurality of shot drops includes a step of forming additional shot drops near predetermined ones of the plurality of shot drops.

2 Claims, 10 Drawing Sheets

DRAWING METHOD, DRAWING APPARATUS AND DISPLAY APPARATUS

RELATED APPLICATIONS

This application claims priority to Japanese Patent Application No. 2003-348423 filed Oct. 7, 2003 which is hereby expressly incorporated by reference herein in its entirety.

BACKGROUND

1. Technical Field

The present invention relates to a drawing method and a drawing apparatus operating in an ink-jet mode for ejecting droplets of a liquid material, and to a display apparatus.

2. Background Art

As a conventional method of forming a filter material and the like for a color filter in the pixel areas on a substrate on which droplets are ejected by using a drawing apparatus in an ink-jet mode, there is a method in which droplets (a material for a color filter) are sequentially arranged in an array in pixel areas of each color constituting the color filter.

In the conventional method, however, there is a problem in that the periphery of the pixel areas, a corner part thereof in particular, is not sufficiently filled with the droplets. Moreover, the droplets are sequentially ejected on the pixel areas and on a boundary layer separating each of the pixel areas, so that the patterns of droplets arrangement are different in each of the pixel areas. In other words, the color tone is not uniform in each of the pixel areas.

The present invention has been achieved in view of the aforementioned problems. An object of the invention is to provide a drawing method and a drawing apparatus which are capable of filling the corner part of the pixel areas with droplets and arranging the droplets uniformly in color tone in each of the pixel areas, and to provide a display apparatus.

SUMMARY

A drawing method according to the invention comprises a step of forming a plurality of shot drops by ejecting droplets from a plurality of nozzles of a drawing apparatus to a plurality of pixel areas on a substrate, wherein the step of forming the plurality of shot drops includes a step of forming an additional plurality of shot drops around predetermined shot drops.

According to this drawing method, the shot drops reliably spread on all of the pixel areas by forming additional shot drops on the parts of the pixel areas on which the shot drops do not easily spread. Thereby, each of the pixel areas is filled with uniform shot drops.

In this case, it is preferable that the step of forming the plurality of shot drops includes a step of forming the predetermined shot drops in the vicinity of a corner part of the pixel areas.

With this constitution, the arrangement of additional shot drops can be clarified by predetermining the shot drops which are hard to spread as the shot drops at the corner part of the pixel areas.

In this case, it is preferable that the plurality of pixel areas are arranged parallel to an array of the plurality of nozzles and that the step of forming the plurality of shot drops includes a step of forming the shot drops by ejecting the droplets from the plurality of nozzles to the plurality of pixel areas at about the same time (i.e., substantially simultaneously).

With these constitutions, the nozzles and each of the pixel areas exist sequentially in the same positional relationship, and the shot drops can be formed on a plurality of pixel areas at about the same time.

A drawing apparatus according to the invention comprises a plurality of nozzles forming a plurality of shot drops by ejecting droplets to a plurality of pixel areas separated by a boundary layer on a substrate, wherein an additional plurality of shot drops are formed around predetermined shot drops.

According to this drawing apparatus, additional shot drops can be formed at the periphery of the predetermined shot drops, and the shot drops can be flexibly arranged on pixel areas with various shapes.

In this case, it is preferable that the plurality of nozzles are arranged parallel to the plurality of pixel areas and that the shot drops are formed in the plurality of pixel areas at about the same time.

With this constitution, the nozzles and the pixel areas extend in parallel, so that the shot drops can be formed by ejecting droplets from the plurality of nozzles to the plurality of pixel areas at about the same time, which enables an efficient arrangement of shot drops.

A display apparatus according to the invention is provided with a filter material or a luminescence material in the pixel areas by the aforementioned drawing method or drawing apparatus.

Since the shot drops with the filter or luminescence material are formed on the pixel areas by using the aforementioned drawing method or drawing apparatus, the filter or luminescence material can be efficiently provided in the pixel areas of the display apparatus. Further, a display apparatus capable of preventing the scattering of shot drops in the arrangement in each pixel area and capable of providing a favorable display can be obtained.

BRIEF DESCRIPTION OF THE DRAWINGS

FIG. 5(*a*) is a detail view showing a constitution of the ejecting head and FIG. 5(*b*) is a sectional view showing a constitution of the nozzles.

FIG. 7(*a*) is a sectional view showing a constitution of a color filter display apparatus and FIG. 7(*b*) is a view showing a frame format of a manufacturing apparatus of the color filter display apparatus.

FIG. 8(*a*) is a plan view showing a constitution of pixel areas of a color filter and FIG. 8(*b*) is a sectional view of the color filter.

FIG. 9(*a*) is a sectional view showing a constitution of an electroluminescence display apparatus and FIG. 9(*b*) is a view showing a frame format of a manufacturing apparatus of the electroluminescence display apparatus.

FIG. 10(*a*) is a sectional view showing a constitution of a plasma display apparatus and FIG. 10(*b*) is a view showing a frame format of a manufacturing apparatus of the plasma display apparatus.

DETAILED DESCRIPTION

A drawing method according to the invention will be described with reference to drawings. In this method, red (R), green (G) and blue (B) filter materials are ejected as droplets from nozzles of a drawing apparatus to be described later to pixel areas of a color filter, etc. Here, a description will be given by exemplifying the pixel areas of a color filter. As shown in FIG. 8(b), a color filter 110 comprises a transparent filter substrate 111, a boundary layer 112 formed in a lattice-like pattern on one surface of the filter substrate 111, pixel areas 105R, 105G, 105B which are separated by the boundary layer 112 and on which a filter material is coated, and an overcoat layer 114 which coats the boundary layer 112 and the filter material.

The pixel areas 105, as shown in FIG. 8(a) as an example, are separated by the boundary layer 112 which is rectangular in a planar shape. The long side direction of each of the pixel areas 105 runs in parallel to the y-axis direction. A plurality of red (R) pixel areas 105R extend in the y-axis direction in an array, and a plurality of green (G) pixel areas 105G extend in the y-axis direction in an array, adjacent to the array of red (R) pixel areas 105R. Similarly, a plurality of blue (B) pixel areas 105B extend in an array, adjacent to the array of green (G) pixel areas 105G. This arrangement is repeated in order of red (R), blue (B), green (G), to form an array of pixel areas 105.

Embodiment 1

Figure 1:
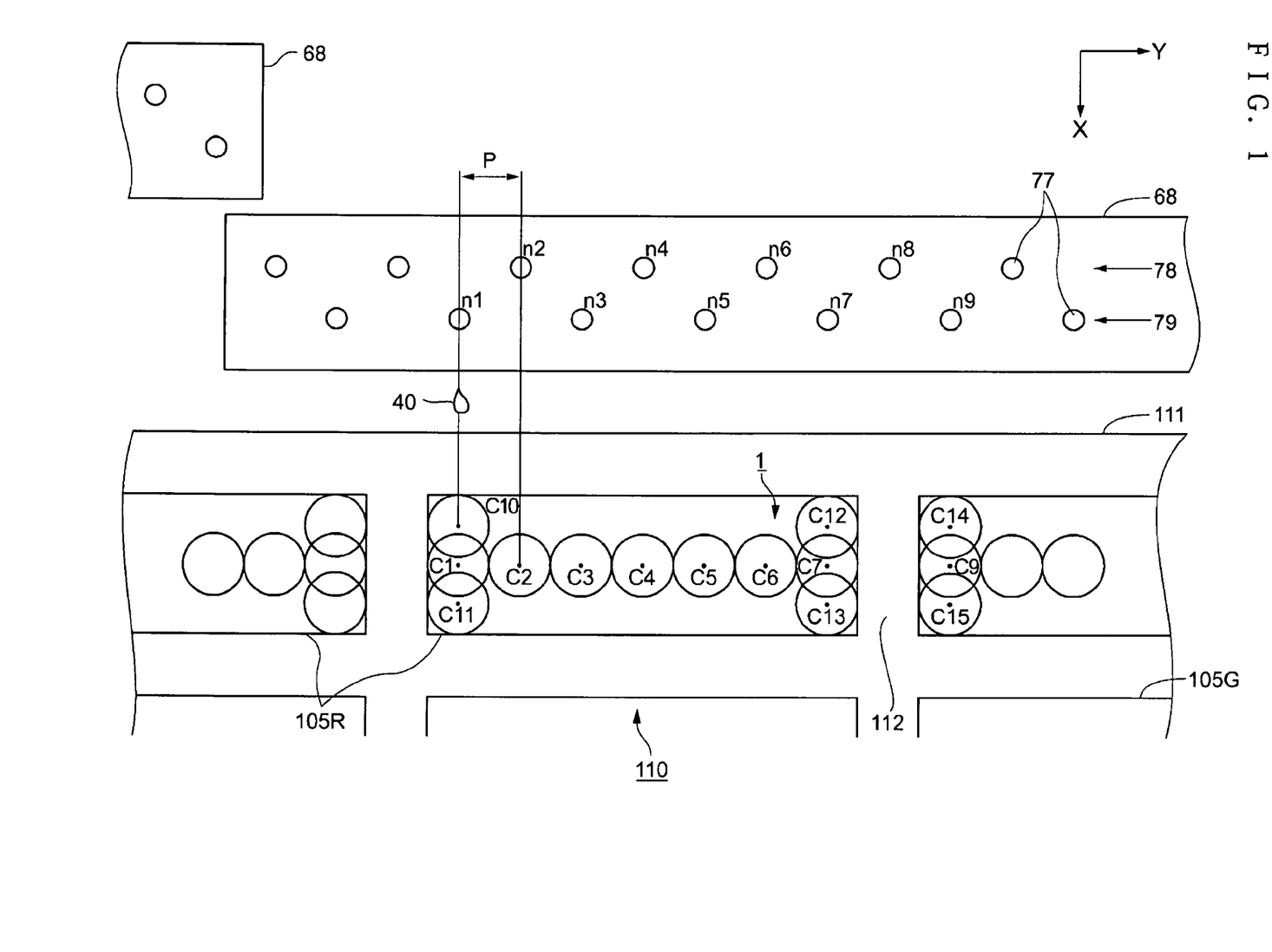
FIG. 1 is a view showing a frame format of Embodiment 1 in which droplets are arranged on pixel areas.

A method of ejecting and coating a filter material as droplets from the nozzles of a drawing apparatus to the pixel areas 105 of the color filter 110 by using a drawing method according to the invention will now be described. In the color filter 110, as shown in FIG. 1, an array of pixel areas 105R on which the red (R) filter material is coated is arranged on the filter substrate 111. In the drawing apparatus, nozzles 77 are arranged to form two nozzle arrays 78 and 79 which run parallel to the y-axis direction of an ejecting head 68. The nozzles 77 in the nozzle array 78 and the nozzles 77 in the nozzle array 79 are shifted from each other in the y-axis direction, and a nozzle pitch in the y-axis direction of the ejecting head 68 is P. A plurality of ejecting heads 68 is arranged in the y-axis direction so that the nozzles 77 extend sequentially in the y-axis direction at a pitch P.

With this constitution, either the pixel areas 105R or the ejecting head 68 shifts relatively so that the pixel areas 105R can be located directly below the ejecting head 68, to eject droplets 40 of the red filter material from the nozzles 77 of the nozzle arrays 78 and 79 to the pixel areas 105R. After the droplets have been shot to one of the pixel areas 105R, the droplets change into shot drops 1 in accordance with the volume of the droplets 40. For example, one of the droplets 40 ejected from a nozzle n2 of the nozzle array 78 changes into a shot drop c2 after being shot to one of the pixel areas 105R. Similarly, one of the droplets 40 ejected from a nozzle n3 of the nozzle array 79 changes into a shot drop c3 after being shot to one of the pixel areas 105R. In this manner, the pixel areas 105R are coated with the red filter material by a plurality of shot drops 1.

The outer peripheral diameter of the shot drops 1 is determined by the volume and surface tension of the droplets 40 ejected from the nozzles 77 and by the surface contact angle of the droplets 40 and the filter substrate 111. Therefore, the outer peripheral diameter of the shot drops 1 can be varied by changing the volume of the droplets 40, and suitable shot drops 1 can be arranged on pixel areas 105 with various sizes. The volume of the droplets 40 can be varied in a range from, for example, 0 pl (pico liter) to 42 pl. When the filter substrate 111 is made of glass, the surface contact angle of the filter material and the glass is preferably 15 degrees. When the volume of the droplets 40 is 6 pl, the outer peripheral diameter of the shot drops 1 is determined to be 60 μm. When the volume of the droplets 40 is 26 pl, the outer peripheral diameter of the shot drops 1 is determined to be 100 μm.

Here, an example of coating the filter material will be briefly described. First, there is a way of arranging seven shot drops 1 in the order of c1, c2, c3, . . . , c7, for example, at about the central position of the short side direction of the pixel areas 105R in an array along the long side direction. Each of the shot drops 1 mixes with each other, spreads more widely compared with the case of spreading without mixing, and fills the pixel areas 105R. However, four corner parts of the rectangular pixel areas 105R are not easily and sufficiently filled with the filter material only by the shot drops c1 and c7 that are located near the corner part. If the pixel areas 105R are not filled with the filter material, there remains a part on which the red filter material is not coated, which becomes an unclear area partly without red display. In addition, a well-balanced color tone cannot be achieved between the red area and other pixel areas 105R. The same is true for the green (G) and blue (B) pixel areas 105G and 105B.

In this embodiment, a plurality of shot drops 1 are arranged at the corner parts of the pixel areas 105R which are not easily filled with the filter material. Further in this embodiment, the size of the pixel areas 105R is determined by the arrangement of the nozzles 77 at a pitch P. More specifically, the size of the pixel areas 105R is determined by the volume of the droplets 40, that is, the outer peripheral diameter of the shot drops 1 created by the droplets 40 and the number of the shot drops 1. Thereby the droplets 40 can be efficiently arranged on the pixel areas 105R by ejecting from the nozzles 77.

Here, the nozzle pitch P of the ejecting head 68 in the y-axis direction is set at 60 μm, the space between the nozzle arrays 78 and 79 is set at 80 μm and the volume of the droplets 40 ejected from the ejecting head 68 is set at 6 pl. Since the filter substrate 111 is made of glass, the outer peripheral diameter Φ of the shot drops created by the droplets 40 with the volume of 6 pl is set to be 60 μm. When seven drops, for example, of the droplets 40 are arranged to contact with each other in the long side direction (y-axis direction) of the pixel areas 105R, the long side length of the pixel areas 105R is set to be 420 μm. When three drops overlap each other by 20 μm in the short side direction (x-axis direction), the short side length of the pixel areas 105R is set to be 140 μm. The width of the boundary layer 112 is the same as the outer peripheral diameter of the shot drops, 60 μm. A plurality of pixel areas 105R having this size is arranged in the y-axis direction with the boundary layer 112 as a boundary. The green (G) and blue (B) pixel areas 105G and 105B are arranged in the same manner.

The drawing method in which the filter material is coated on these pixel areas 105 will be described. Either the pixel areas 105R or the ejecting head 68 shifts relatively so that the pixel areas 105R to be coated with the red (R) filter material can be located directly below the ejecting head 68, to eject droplets 40 from nozzles n1 and n7, and to form shot drops c10 and c12 respectively at the upper left and right corners of one of the pixel areas 105R in FIG. 1. Next, the ejecting head 68 shifts in the forward direction of x-axis by 40 μm to eject the droplets 40 from nozzles n1, n3, n5 and n7 and shot drops c1, c3, c5 and c7 are formed. The center of the shot drop c1 (or x-coordinate) is located apart from the center of the shot drop c10 (x-coordinate) in the x-axis direction by 40 μm, and the shot drops c1 and c10 overlap each other by 20 μm. The center of the shot drop c7 (or x-coordinate) is located apart from the center of a shot drop c12 (x-coordinate) in the x-axis direction by 40 μm, and the shot drops c7 and c12 overlap each other by 20 μm. The shot drops c3 and c5 are arranged apart from each other on the y-axis line connecting the shot drops c1 and c7.

The ejecting head 68 shifts further in the forward direction of x-axis by 40 μm to eject the droplets 40 from the nozzles n1 and n7 and shot drops c11 and c13 are formed. The shot drops c11 and c13 overlap the shot drops c1 and c7 by 20 μm, respectively. Then the ejecting head 68 shifts further by 40 μm to eject the droplets 40 from nozzles n2, n4 and n6 and shot drops c2, c4 and c6 are formed. The shot drop c2 is arranged between the shot drops c1 and c3 which have already been shot, the shot drop c4 is arranged between the shot drops c3 and c5 and the shot drop c6 is arranged between the shot drops c5 and c7. Note that the shot drops c1, c3, c5 and c7 are approximately arranged on the line parallel to the long side of the pixel areas 105R and which divides the short side of the pixel areas 105R in half.

Coated on the pixel areas 105R are seven shot drops c1 to c7 arranged in an array on the central part thereof, shot drops c10 and c11 arranged on both sides of the shot drop c1 in the x-axis direction and shot drops c12 and c13 arranged on both sides of the shot drop c7 in the x-axis direction. By arranging plural drops of shot drops 1 at the corner parts of the pixel areas 105R, the red (R) filter material can be reliably coated on the entire pixel area of each pixel area 105R.

Also on other red (R) pixel areas 105R, the filter material is coated at the same time in the same arrangement of the shot drop 1. On the pixel areas 105R adjacent to one of the pixel areas 105R on which the filter material is coated by the nozzles n1 to n7, the filter material is coated in the same manner and at the same time by seven nozzles 77 starting from n9. For example, the nozzle n9 forms shot drops c14, c9 and c15 in synchronization with forming the shot drops c10, c1 and c11 by the nozzle n1. Note that the nozzles 77 located on the boundary layer 112 between the pixel areas 105R are closed for stopping ejecting. This kind of nozzle 77 corresponds to the nozzle n8 between the nozzles n7 and n9, and the like. In this manner, the filter material is simultaneously coated on the red (R) pixel areas 105R in the y-axis direction. Since the shot drops 1 are coated on each of the pixel areas 105R in the same arrangement, pixel areas 105R with uniform color tone can be obtained.

The size of the pixel areas 105R can be easily changed by changing the number and size of the shot drops 1 to be shot on the pixel areas 105R. Although the explanation has been given by referring an example of the red (R) pixel areas 105R, the same goes for the green (G) and blue (B) pixel areas 105G and 105B.

Embodiment 2

Figure 2:
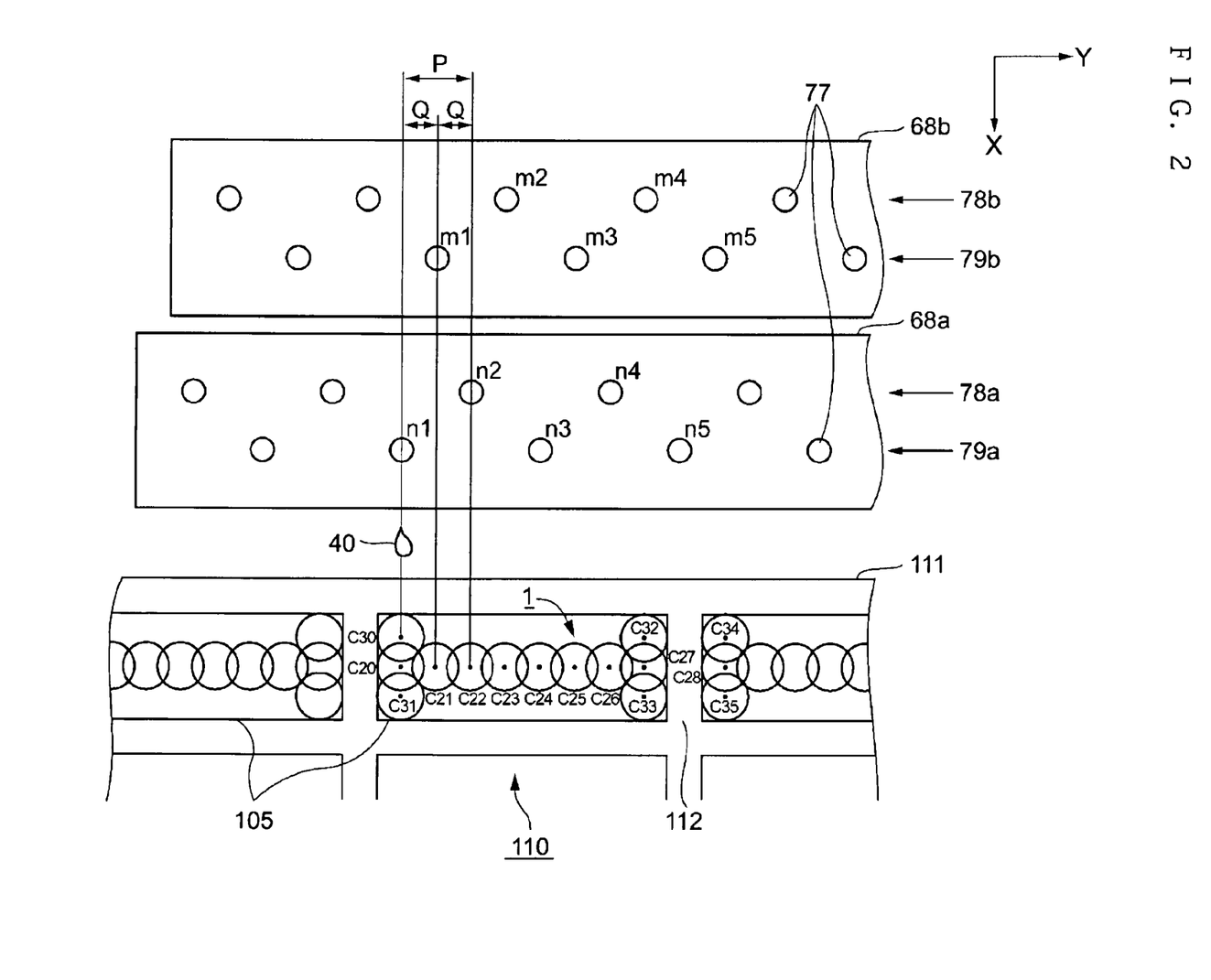
FIG. 2 is a view showing a frame format of Embodiment 2 in which droplets are arranged on pixel areas.

Next, the case will be described where the same ejecting head 68 is used and the droplets 40 are arranged more minutely with pitch P narrowed. In this case, as shown in FIG. 2, two ejecting heads 68a and 68b having nozzles 77 at pitch P are arranged in parallel and shifted from each other by an amount Q which is half of the pitch P. Each of the two ejecting heads 68a and 68b corresponds to one ejecting head 68 in Embodiment 1.

Here, assuming that the nozzle pitch P of the ejecting heads 68a and 68b in the y-axis direction is 60 μm and that both ejecting heads 68a and 68b constitute one ejecting head group, the nozzle pitch Q is set to be 30 μm. The space between each head array, that is, between nozzle arrays 78a and 79a of the ejecting head 68a, between nozzle arrays 78b and 79b of the ejecting head 68b and between nozzle arrays 78a and 79b is 80 μm. The volume of the droplets 40 ejected from the ejecting head group is set at 4 pl. The outer peripheral diameter Φ of the shot drops created by the droplets 40 with the volume of 4 pl is 40 μm. In this case, the length of the pixel areas 105 in the long side direction (y-axis direction) is 250 μm, which corresponds to the length of the arrangement in which eight drops of the droplets 40 overlap each other by 10 μm. The length of the pixel areas 105 in the short side direction (x-axis direction) is 90 μm, which corresponds to the length of the arrangement in which three drops of the droplets 40 overlap each other by 15 μm. The width of the boundary layer 112 corresponds to the minimum space of the outer periphery between the shot drops 1 which do not overlap each other, 20 μm.

In the drawing method in which the filter material is coated on these pixel areas 105, either the pixel areas 105 or the ejecting head 68 shifts relatively so that the pixel areas 105 to be coated with the filter material can be located directly below the ejecting head 68a, to eject droplets 40 from the nozzle n1, and to form a shot drop c30 at the upper left corner of one of the pixel areas 105 in FIG. 2. Next, the ejecting head group shifts in the forward direction of x-axis by 25 μm to eject the droplets 40 from the nozzles n1 and n3 of the ejecting head 68a and shot drops c20 and c24 are formed. The center of the shot drop c20 (or x-coordinate) is located apart from the center of the shot drop c30 (x-coordinate) in the x-axis direction by 25 μm, and the shot drops c20 and c30 overlap each other by 20 μm. The ejecting head 68a shifts in the forward direction of x-axis by 25 μm to eject the droplets 40 from the nozzle n1 and a shot drop c31 is formed. The shot drops c31 and c20 overlap each other by 15 μm. From this state, the ejecting head 68a shifts further by 55 μm to eject the droplets 40 from the nozzle n2 and n4 and shot drops c22 and c26 are formed. Subsequently, the ejecting head group shifts by 80 μm and shot drops c21 and c25 are formed by nozzles m1 and m3 of the ejecting head 68b. The ejecting head 68b shifts by 55 μm and a shot drop c32 is formed by a nozzle m4 at the upper right corner of one of the pixel areas 105, and shifts by 25 μm and shot drops c23 and c27 are formed by nozzles m2 and m4. Finally, the ejecting head 68b shifts by 25 μm and a shot drops c33 is formed by the nozzle m4. The shot drop c27 overlaps the shot drop c32 and c33 by 15 μm, respectively. Also, the shot drops c21 to c26 are arranged in this order each overlapping by 10 μm on the y-axis line connecting the shot drops c20 and c27. Note that the shot drops c20, c21, c22, c23, c24, c25, c26 and c27 are approximately arranged on the line parallel to the long side of the pixel areas 105R and which divides the short side of the pixel areas 105R in half.

Also on the adjacent pixel areas 105 in the y-axis direction with the boundary layer 112 as a boundary, the shot drops 1 can be arranged in the same pattern by controlling each of the nozzles 77. Note that since the nozzle n5 next to the nozzle m4 by which the shot drops 1 are arranged at the corner part is located on the boundary layer 112, the nozzle n5 is closed for stopping ejecting the droplets 40. One of the pixel areas 105 next to the aforementioned pixel area is formed by eight nozzles 77 starting from m5, next to the nozzle n5. The space of the outer periphery between the shot drops c32 and c34 formed respectively by the nozzles m4 and m5 is 20 μm, which corresponds to the width of the boundary layer 112.

As described above, the nozzle pitch can be narrowed by using the combination of ejecting heads 68, which enables more minute constitution of the shot drops 1. Also in this case, since the shot drops 1 are coated on each of the pixel areas 105R in the same arrangement, pixel areas 105R with uniform color tone can be obtained.

Figure 3:
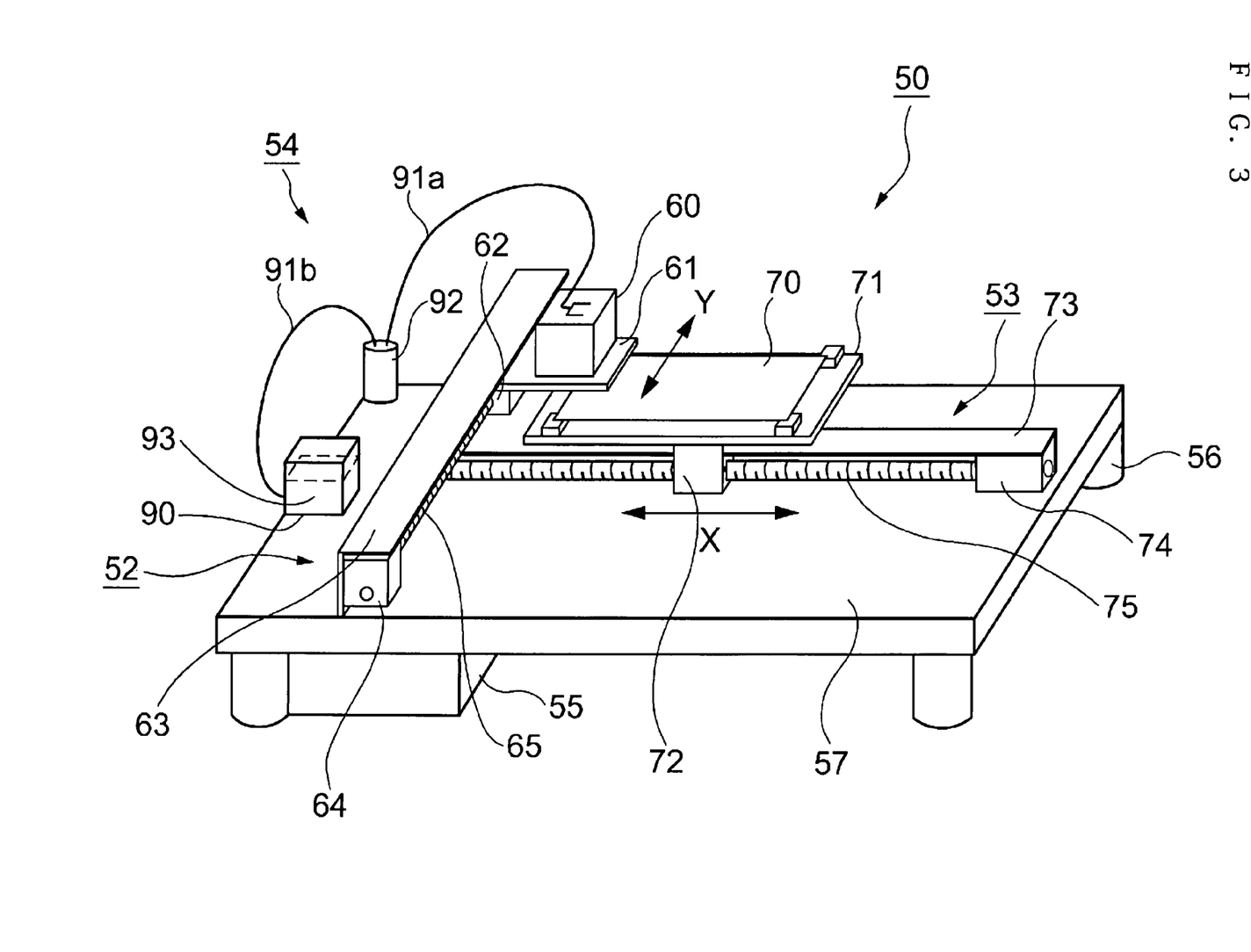
FIG. 3 is a perspective view showing an appearance of a drawing apparatus.

Next, a drawing apparatus used for the drawing method heretofore described will be described. As shown in FIG. 3, a drawing apparatus 50 comprises a head mechanism part 52 having a head part 60 for ejecting the droplets 40, a work mechanism part 53 having a workpiece (work) 70 to which the droplets 40 ejected from the head part 60 are ejected, a liquid material supply part 54 for supplying a liquid material 93 to the head part 60, and a controller 55 for controlling these mechanisms and a supply part as a group.

The drawing apparatus 50 is equipped with a plurality of supporting legs 56 placed on a floor and a surface table 57 placed on the upper side of the supporting legs 56. On the upper side of the surface table 57, the work mechanism part 53 is arranged to extend in a longitudinal direction (x-axis direction) of the surface table 57. On the upper side of the work mechanism part 53, the head mechanism part 52 supported at both the ends by two pillars secured to the surface table 57 is arranged to extend in a direction perpendicular to the work mechanism part 53 (y-axis direction). On one end of the surface table 57, the liquid material supply part 54 for supplying the liquid material 93 is arranged communicating with the head part 60 of the head mechanism part 52. On the underside of the surface table 57, the controller 55 is housed.

The head mechanism part 52 comprises: the head part 60 for ejecting the liquid material 93; a carriage 61 with the head part 60 thereon; a y-axis guide 63 for guiding the carriage 61 in the y-axis direction; a y-axis ball screw 65 placed under the y-axis guide 63 in the y-axis direction; a y-axis motor 64 for rotating the y-axis ball screw 65 in the forward/backward direction; and a carriage screwing part 62 located under the carriage 61 and having a female screw part for moving the carriage 61 by screwing the y-axis ball screw 65.

The work mechanism part 53 is located under the head mechanism part 52 and arranged in the x-axis direction in almost the same constitution as the head mechanism part 52. The work mechanism part 53 comprises: a workpiece 70; a mounting table 71 with the workpiece 70 thereon; an x-axis guide 73 for guiding the mounting table 71; an x-axis ball screw 75 placed under the x-axis guide 73; an x-axis motor 74 for rotating the x-axis ball screw 75 in the forward/backward direction; and a mounting table screwing part 72 located under the mounting table 71 and moving the mounting table 71 by screwing the x-axis ball screw 75.

Note that each of the head mechanism part 52 and the work mechanism part 53 has a position detecting means for detecting the position to which the head part 60 and the mounting table 71 have moved, which is not shown in the Figure. In the carriage 61 and the mounting table 71, a mechanism for adjusting the rotating direction (so-called Θ axis) is incorporated and capable of adjusting the rotating direction by setting the center of the head part 60 as a center of rotation and of adjusting the rotating direction of the mounting table 71.

With these constitutions, the head part 60 and the workpiece 70 can reciprocate in the y-axis and x-axis directions, respectively. First, the movement of the head 60 will be described. The y-axis ball screw 65 rotates in the forward/backward direction with the rotation of the y-axis motor 64 in the forward/backward direction, and the carriage 61 integrated with the carriage screwing part 62 moves to any position with the movement of the carriage screwing part 62 screwing the y-axis ball screw 65 along the y-axis guide 63. In other words, the head part 60 on the carriage 61 freely moves in the y-axis direction with the drive of the y-axis motor 64. Similarly, the workpiece 70 on the mounting table 71 freely moves in the x-axis direction.

As described above, the head part 60 moves to the ejecting position in the y-axis direction, stops and ejects the droplets 40 in synchronization with the movement of the workpiece 70 located thereunder in the x-axis direction. By controlling relatively the workpiece 70 moving in the x-axis direction and the head part 60 moving in the y-axis direction, a specific drawing and the like can be performed on the workpiece 70.

The liquid material supply part 54 for supplying the liquid material 93 to the head part 60 comprises: a tube 91a for forming a flow channel communicating with the head part 60; a pump 92 for feeding the liquid material 93 into the tube 91a; a tube 91b for supplying the liquid material 93 to the pump 92; and a tank 90 communicating with the tube 91b and storing the liquid material 93. The liquid material supply part 54 is arranged on one end of the surface table 57.

Considering refilling and changing the liquid material 93, it is desirable for the tank 90 to be placed on the upper side or underside of the surface table 57. However, if the tank 90 can be placed on the upper side of the head part 60, the tank 90 and the head 60 can be connected by one flexible tube without using the pump 92, so that the liquid material 93 can be naturally supplied by gravity.

Figure 4:
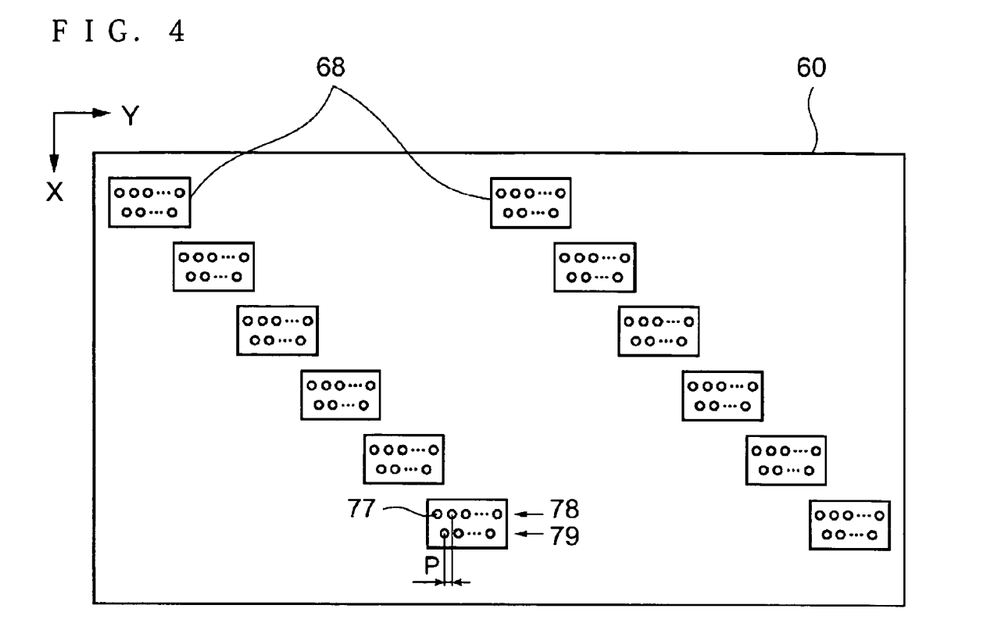
FIG. 4 is a plan view showing an arrangement of ejecting heads and nozzles in Embodiment 1.

The head part 60 holds a plurality of the ejecting heads 68 having the same structure each other, as shown in FIG. 4. Here, FIG. 4 illustrates the head part 60 in Embodiment 1 described by referring to FIG. 1, and in FIG. 4, the head part 60 is observed from the mounting table 71 side. In the head part 60, an array constituted by six ejecting heads 68 is arranged so that the longitudinal direction of each of the ejecting heads 68 runs in parallel to the y-axis direction. Twelve ejecting heads 68 are arranged in this case. Each of the ejecting heads 68 for ejecting the liquid material 93 has two nozzle arrays 78 and 79 extending in the longitudinal direction of each of the ejecting heads 68. One nozzle array is constituted by 180 nozzles 77 in an array at even intervals. Each of the nozzles 77 of the nozzle array 78 is arranged midway between two nozzles 77 of the nozzle array 79. Adjacent nozzles 77 are arranged at pitch P at even intervals. Twelve ejecting heads 68 are arranged stepwise in the x-axis direction so that the nozzles 77 of each of the ejecting heads 68 are sequentially arranged at pitch P in the y-axis direction.

As shown in FIG. 5(a) and FIG. 5(b), each of the ejecting heads 68 has a diaphragm 83 and a nozzle plate 84. Between the diaphragm 83 and the nozzle plate 84, a reservoir 85 is located in which the liquid material 93 supplied through a hole 87 from the tank 90 is always filled. Also, between the diaphragm 83 and the nozzle plate 84, a plurality of walls 81 are located. A cavity 80 is a part surrounded by the diaphragm 83, the nozzle plate 84 and a pair of walls 81. Since the cavity 80 is provided corresponding to the nozzles 77, the number of the cavity 80 is the same as that of the nozzles 77. In the cavity 80, the liquid material 93 is supplied from the reservoir 85 through a supply port 86 located between a pair of the walls 81.

On the diaphragm 83, a resonator 82 is located corresponding to each cavity 80. The resonator 82 is constituted by a piezoelectric element 82c and a pair of electrodes 82a and 82b sandwiching the piezoelectric element 82c. By supplying a drive voltage to the pair of electrodes 82a and 82b, the liquid material 93 is ejected as the droplets 40 from the corresponding nozzles 77. In the case of the color filter 110, the droplets 40 are ejected to the pixel areas 105 surrounded by the filter substrate 111 and the boundary layer 112, to form R, G, B pixel areas 105R, 105G and 105B.

Next, a description will be given about the controller 55 for controlling the constitution as described above with reference to FIG. 6. The controller 55 has a command part 30 and a drive part 95. The command part 30 is constituted by CPU 99, ROM, RAM and an I/O interface 94. In the command part 30, the CPU 99 processes various signals inputted through the I/O interface 94 on the basis of the data of ROM and RAM, a control signal is output to the drive part 95 through the I/O interface 94 and control is performed.

Figure 6:
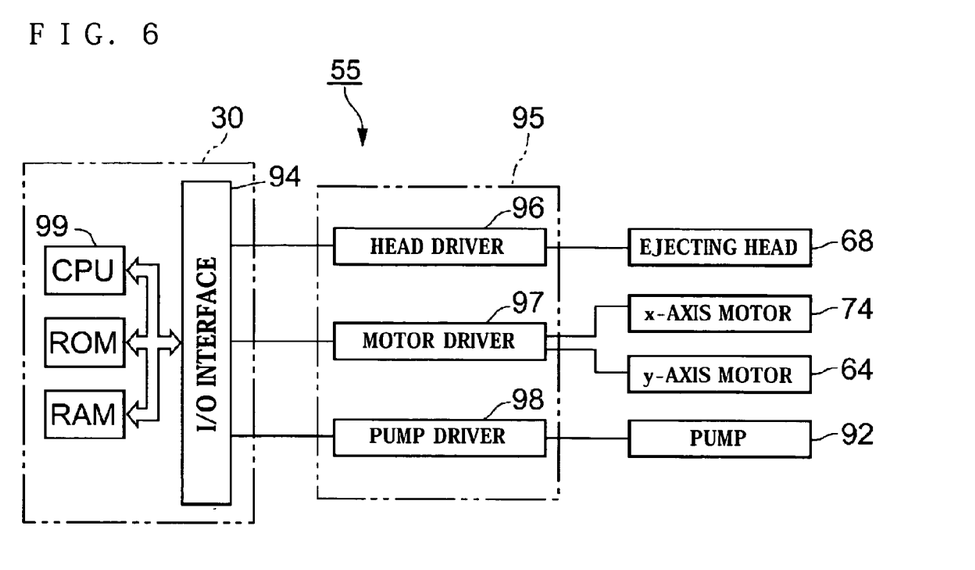
FIG. 6 is a block diagram illustrating a controller of the drawing apparatus.

The drive part 95 is constituted by a head driver 96, a motor driver 97 and a pump driver 98. The motor driver 97 rotates the x-axis motor 74 and the y-axis motor 64 in forward/backward direction by the control signal from the command part 30 and controls the movement of the workpiece 70 and the head part 60. The head driver 96 controls the ejection of the liquid material from the ejecting head 68 and enables a specific drawing to be performed on the workpiece 70 in synchronization with the control of the motor driver 97. The pump driver 98 controls the pump 92 in accordance with the ejection state of the liquid material 93 and controls the supply of the liquid material 93 to the ejecting head 68 optimally.

The controller 55 is constituted to give signals independent on each other to each of a plurality of resonators 82. Therefore, the volume of the droplets 40 ejected from the nozzles 77 is controlled in each of the nozzles 77 in accordance with the signal from the head driver 96. Further, the volume of the droplets 40 ejected from each of the nozzles 77 is variable in the range of 0 pl to 42 pl, which advantageously permits a wide range of choice in selecting the volume of the droplets 40 and the outer peripheral diameter of the shot drops.

Next, a description will be given about various kinds of high-quality display apparatus manufactured by using the drawing method and the drawing apparatus 50 in the invention heretofore explained. Here, a color filter display apparatus, an electroluminescence display apparatus and a plasma display apparatus will be described as the display apparatus.

Figure 7:
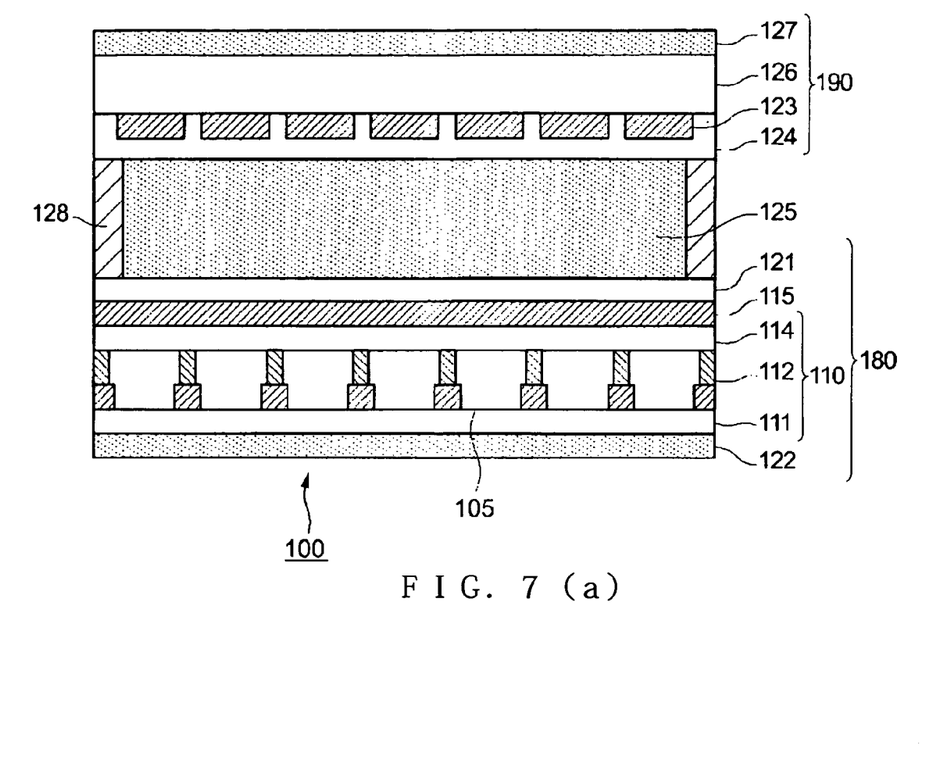

FIG. 7 is a sectional view showing the constitution of the color filter display apparatus. As shown in FIG. 7, a color filter display apparatus 100 has polarizing plates 122 and 127 which are arranged opposing to each other, a color filter 110 at the inner surface of the polarizing plate 122, and a pixel electrode 115 at the inner side of the color filter 110. The light from the back light enters from the outer surface direction of the polarizing plate 122. A counter substrate 126 is formed at the inner surface of the polarizing plate 127. Between the pixel electrode 115 and the counter substrate 126, alignment films 121 and 124 are formed. At the inner surface of the counter substrate 126, a TFT (thin-film transistor) element (not shown) and a counter electrode 123 are formed in a matrix. By enclosing a liquid crystal 125 in the space surrounded by sealing parts 128 located between the alignment films 121 and 124, the color filter display apparatus 100 is constituted.

By applying the drawing method and the drawing apparatus 50 in the invention, the color filter 110 can be efficiently manufactured. In this case, as shown in FIG. 8(a), the color filter 110 corresponding to the workpiece 70 in the drawing apparatus 50 in FIG. 3 has the pixel areas 105 arranged in a matrix, the border of which is separated by the boundary layer 112 formed by using a dispenser, screen printing or photolithography. One of color filter materials; red (R), green (G), blue (B) is introduced into each of the pixel areas 105.

Figure 8:
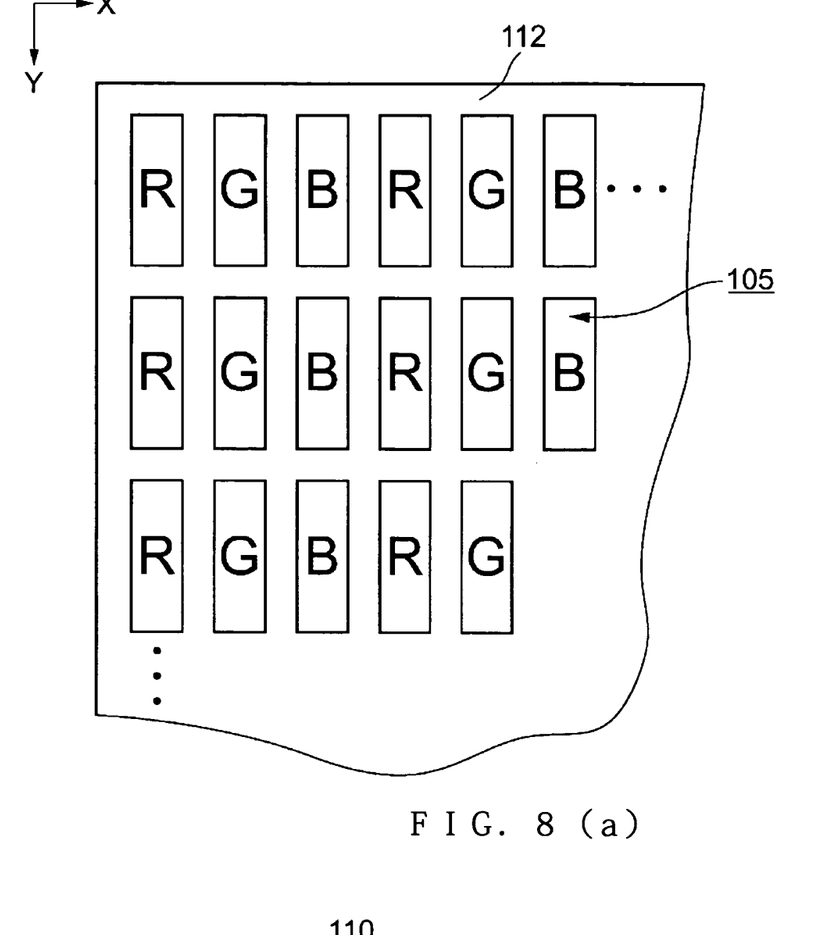

As shown in FIGS. 7 and 8, the color filter 110 has the light translucent filter substrate 111 and the light shielding boundary layer 112, and pixel areas 105 are formed in the part where the boundary layer 112 is not formed. On the upper part of the boundary layer 112 and the pixel areas 105, the overcoat layer 114 is formed. Note that the pixel areas 105 may have striped and deltoid arrangements as well as a mosaic-like arrangement as shown in FIG. 8(a).

Figure 5:
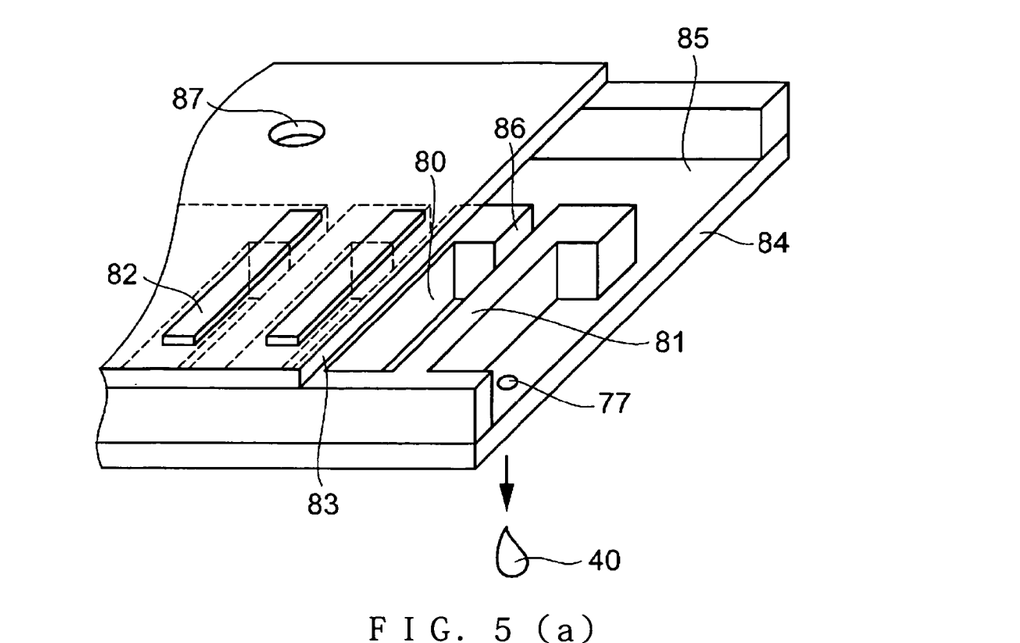

The pixel areas 105 is formed by using the drawing apparatus 50 and the drawing method described with reference to FIGS. 1 and 2, and by selectively ejecting the droplets 40 of R, G, B color filter materials from the nozzles 77 shown in FIG. 5 to each of the pixel areas 105 formed by being separated by the boundary layer 112 as shown in FIG. 8(b). The pixel areas 105 of each color are obtained by drying the coated droplets 40. In addition, the overcoat layer 114 can be formed by using the drawing apparatus 50 and ejecting an overcoat material from the ejecting head 68.

A manufacturing apparatus 130 shown in FIG. 7(b) is a group of apparatus including an ejecting apparatus for ejecting the droplets 40 of the corresponding color filter material to each of the pixel areas 105 formed in the color filter 110 of the color filter display apparatus 100. Each ejecting apparatus is the drawing apparatus 50. The manufacturing apparatus comprises: an ejecting apparatus 140R for coating the red color filter material on all of the pixel areas 105R on which the red color filter material should be coated; a drying apparatus 150R for drying the color filter material on the pixel areas 105R; an ejecting apparatus 140G for coating the green color filter material on all of the pixel areas 105G on which the green color filter material should be coated; a drying apparatus 150G for drying the color filter material on the pixel areas 105G; an ejecting apparatus 140B for coating the blue color filter material on all of the pixel areas 105B on which the blue color filter material should be coated; a drying apparatus 150B for drying the color filter material on the pixel areas 105B; an oven 160 for reheating (post-baking) the color filter materials of each color; an ejecting apparatus 140C for providing the overcoat layer 114 on the layer of the post-baked color filter material; a drying apparatus 150C for drying the overcoat layer 114; and a curing apparatus 165 for reheating and curing the dried overcoat layer 114. Further, the manufacturing apparatus 130 has a carrier apparatus 170 for carrying the color filter 110 through the ejecting apparatus 140R, the drying apparatus 150R, the ejecting apparatus 140G, the drying apparatus 150G, the ejecting apparatus 140B, the drying apparatus 150B, the ejecting apparatus 140C, the drying apparatus 150C and the curing apparatus 165, in this order.

Next, the step of enclosing the liquid crystal 125 will be described with reference to FIG. 7(a). A first substrate 180 comprises: the polarizing plate 122 which has already been described; the color filter 110; the pixel electrode 115; and the alignment film 121. A second substrate 190 comprises: the polarizing plate 127; the counter substrate 126; the counter electrode 123; and the alignment film 124. First, on the surface of the first substrate 180, the rectangular sealing parts 128 to form an area for coating the liquid crystal 125 are formed by using a dispenser or screen printing. The liquid crystal 125 is ejected from the nozzles 77 of the ejecting head 68 to the inner side of these sealing parts 128 by using the drawing apparatus 50, similarly to the case of ejecting the color filter material. After the inner side of the sealing parts 128 has been filled with the liquid crystal 125, the second substrate 190 is glued on the sealing parts 128 on the first substrate 180, and the color filter display apparatus 100 is completed.

Figure 9:
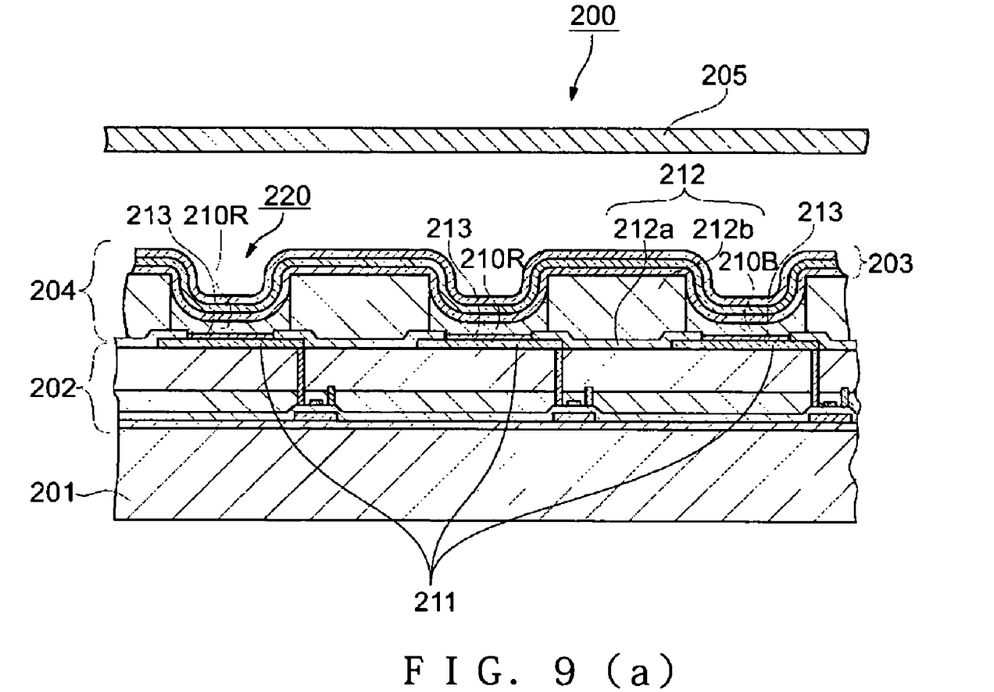

Further, a description will be given about the electroluminescence display apparatus manufactured by using the drawing method and the drawing apparatus 50 in the invention with reference to FIG. 9. In an electroluminescence display apparatus 200, a circuit element part 202 is laminated on a glass substrate 201 and an electroluminescence display element 204 constituting the main part is laminated on the circuit element part 202. A substrate 205 for sealing is formed on the upper side of the electroluminescence display element 204 with a space of inert gas therebetween.

In the electroluminescence display element 204, a boundary layer 212 is formed by laminating an organic boundary layer 212b on an inorganic boundary layer 212a. An emitting part 220 corresponding to the pixel areas 105 of the color filter material in FIG. 8(a) is formed in a matrix by forming the boundary layer 212. In each emitting part 220, a pixel electrode 211, a hole injection/transport layer 213 and an emitting layer 210 of red (R), green (G) or blue (B) are laminated in this order from the bottom, and a counter electrode 203 which is formed by laminating thin films of such as Ca and Al in a plurality of layers by using vacuum evaporation method coats all of the emitting part 220.

The emitting layer 210 is formed by using the drawing apparatus 50 and the drawing method described with reference to FIGS. 1 and 2, and by selectively ejecting luminescence materials of R, G, B colors from the nozzles 77 of the ejecting head 68 to each emitting part 220 formed by being separated by the boundary layer 212, as in the coating of color filter material described with reference to FIG. 7. Emitting layers 210R, 210G and 210B of each color are obtained in each emitting part 220 by drying the coated luminescence materials.

A manufacturing apparatus 230 shown in FIG. 9(b) is a group of apparatus including an apparatus for ejecting the corresponding luminescence material to each emitting part 220 arranged in a matrix. The manufacturing apparatus 230 comprises: an ejecting apparatus 260 for coating a functional liquid to form the hole injection/transport layer 212 on the pixel electrode 211; an ejecting apparatus 240R for coating the red luminescence material on all of the emitting layer 210R on which the red luminescence material should be coated; a drying apparatus 250R for drying the coated red luminescence material; an ejecting apparatus 240G for coating the green luminescence material on all of the emitting layer 210G on which the green luminescence material should be coated; a drying apparatus 250G for drying the coated green luminescence material; an ejecting apparatus 240B for coating the blue luminescence material on the emitting layer 210B on which the blue luminescence material should be coated; and a drying apparatus 250B for drying the coated blue luminescence material. Further, the manufacturing apparatus 230 has a carrier apparatus 270 for carrying the emitting layer 210 through the ejecting apparatus 260, the ejecting apparatus 240R, the drying apparatus 250R, the ejecting apparatus 240G, the drying apparatus 250G, the ejecting apparatus 240B, and the drying apparatus 250B, in this order.

On the emitting part 220 and the boundary layer 212 formed in this manner, a counter electrode 203 is laminated as described above, and an inert gas is enclosed into the space between the counter electrode 203 and the substrate 205 for sealing to complete the electroluminescence display apparatus 200.

Figure 10:
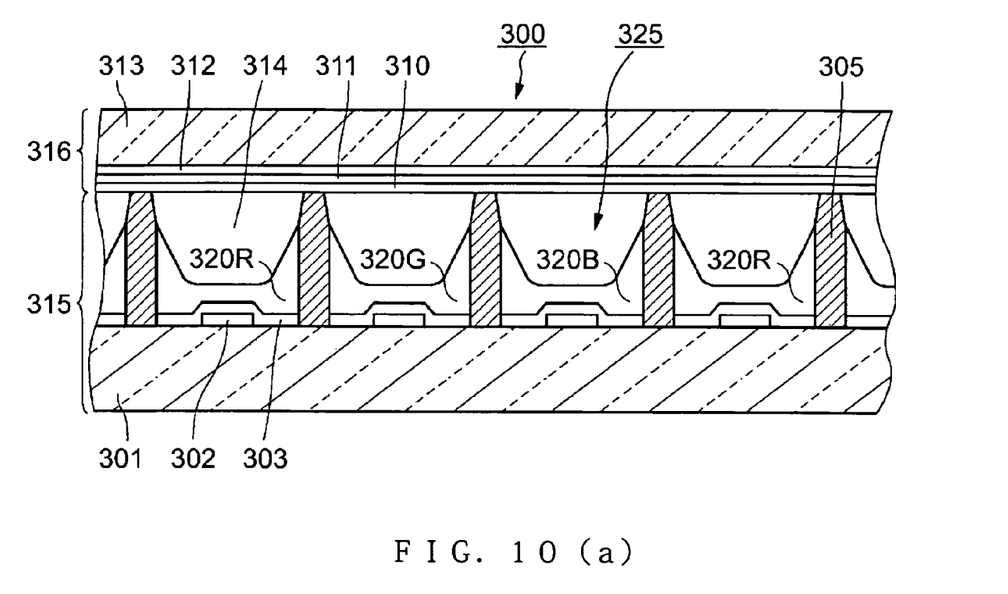

Next, a description will be given about an example of applying the drawing apparatus 50 to a manufacturing apparatus for manufacturing a rear substrate 315 of a plasma display apparatus 300 with reference to FIG. 10. The rear substrate 315 has a plurality of fluorescent parts 325 arranged in a lattice-like pattern. In more detail, the rear substrate 315 further comprises: a supporting substrate 301; a plurality of address electrodes 302 formed in a striped pattern on the supporting substrate 301; a dielectric glass layer 303 formed to cover the address electrode 302; and a boundary layer 305 having a lattice-like shape and determining a plurality of fluorescent areas. A plurality of the fluorescent areas are located in a lattice-like pattern. Each of a plurality of arrays constituted by the fluorescent areas corresponds to each of a plurality of the address electrodes 302. The address electrode 302 and the dielectric glass layer 303 are formed by screen printing.

In the emitting parts 325, luminescence layers 320R, 320G and 320B are formed by using the drawing apparatus 50, and by selectively ejecting plasma luminescence materials of R, G, B colors from the nozzles 77 of the ejecting head 68 to each of the fluorescent areas which corresponds to the pixel area 105 and which is formed by being separated by the boundary layer 305, as in the coating of color filter material described with reference to FIG. 7. The rear substrate 315 is formed by drying the coated plasma luminescence materials.

A manufacturing apparatus 330 shown in FIG. 10(b) is an apparatus for ejecting the corresponding plasma luminescence material to each of the fluorescent parts 325 of the rear substrate 315. The manufacturing apparatus 330 comprises: an ejecting apparatus 340R for coating the red plasma luminescence material on all of a fluorescent layer 320R on which the red plasma luminescence material should be coated; a drying apparatus 350R for drying the coated red plasma luminescence material; an ejecting apparatus 340G for coating the green plasma luminescence material on the fluorescent layer 320G; a drying apparatus 350G for drying the coated green plasma luminescence material; an ejecting apparatus 340B for coating the blue plasma luminescence material on the emitting layer 320B; and a drying apparatus 350B for drying the coated blue plasma luminescence material. Further, the manufacturing apparatus 330 has a carrier apparatus 370 for carrying the rear substrate 315 through the ejecting apparatus 340R, the drying apparatus 350R, the ejecting apparatus 340G, the drying apparatus 350G, the ejecting apparatus 340B, and the drying apparatus 350B, in this order.

Next, as shown in FIG. 10(b), the plasma display apparatus 300 is obtained by bonding the rear substrate 315 and a front substrate 316. The front substrate 316 comprises: a glass substrate 313; a display electrode and a display scanning electrode 312 which are patterned in parallel to each other on the glass substrate 313; a dielectric glass layer 311 formed to cover the display electrode and the display scanning electrode 312; and a protective layer 310 formed on the dielectric glass layer 311. The rear substrate 315 and the front substrate 316 are positioned so that the address electrode 302 of the rear substrate 315 and the display electrode/display scanning electrode 312 of the front substrate 316 can be at right angles to each other. A discharge gas 314 is enclosed into the area surrounded by each boundary layer 305 at a predetermined pressure.

According to the drawing method in the invention, as described above, the shot drops 1 spread on all of the pixel areas 105 reliably by forming additional shot drops 1 at the corner parts and the like in the pixel areas 105 on which the shot drops 1 do not spread easily. Thereby all pixel areas 105 become uniform in color tone. Using this drawing method for manufacturing a display apparatus, a display apparatus with a clear image display can be obtained.

Using the drawing apparatus 50 in the invention, the shot drops 1 can be formed reliably on the pixel areas 105 with various shapes, and a flexible and efficient process can be preformed according to the pixel areas 105.

As described above, the drawing method and the drawing apparatus 50 of the invention can contribute to manufacturing a display apparatus such as the color filter display apparatus 100, the electroluminescence display apparatus 200 and the plasma display apparatus 300. A high-quality electronics device having these display apparatuses can be provided such as TV, personal computer, car navigation system, digital camera, mobile phone and the like. Further, the invention can be applied not only to a color filter display apparatus, an electroluminescence display apparatus and a plasma display apparatus, but also to a display apparatus having an electro-emitter (FED (Field Emission Display)), SED (Surface-Conduction Electron-Emitter Display) and the like.

What is claimed is:

1. A drawing method comprising:
   a) forming a first plurality of drops by ejecting droplets from a plurality of nozzles of a drawing apparatus to a pixel area on a substrate, the first plurality of drops including a plurality of drops formed at corners of the pixel area;
   b) subsequent to a), forming a second plurality of drops in the pixel area, the second plurality of drops being formed along a middle line in the longitudinal direction of the pixel area and having a predetermined spacing between two adjacent drops of the second plurality of drops;
   c) subsequent to b), forming a third plurality of drops in the pixel area, the third plurality of drops including a plurality of drops formed at the other corners of the pixel area; and
   d) subsequent to c), forming a fourth plurality of drops in the pixel area along the middle line of the pixel area, the fourth plurality of drops having the predetermined spacing between two adjacent drops of the fourth plurality of drops.

2. A drawing method comprising:
   a) using a first ejecting head, of a drawing apparatus having the first ejecting head and a second ejecting head, to form a first drop in a pixel area on a substrate at a first corner of the pixel area by ejecting at least one droplet from at least one of a plurality of nozzles of the first ejecting head;
   b) subsequent to a), shifting the drawing apparatus by a first predetermined distance and using the first ejecting head to form second drops in the pixel area along a middle line in the longitudinal direction of the pixel area by ejecting droplets from the plurality of nozzles of the first ejecting head;
   c) subsequent to b), shifting the drawing apparatus by the first predetermined distance and using the first ejecting head to form a third drop in the pixel area at a second corner of the pixel area by ejecting at least one droplet from at least one of the plurality of nozzles of the first ejecting head;
   d) subsequent to c), shifting the drawing apparatus by a second predetermined distance and using the first ejecting head to form fourth drops in the pixel area along the middle line of the pixel area by ejecting droplets from the plurality of nozzles of the first ejecting head; and
   e) subsequent to d), shifting the drawing apparatus by a third predetermined distance and using the second ejecting head to form fifth drops in the pixel area along the middle line of the pixel area by ejecting droplets from a plurality of nozzles of the second ejecting head.

* * * * *